(12) United States Patent
Yoshimatsu

(10) Patent No.: US 9,550,939 B2
(45) Date of Patent: *Jan. 24, 2017

(54) RED EMITTING NITRIDE FLUORESCENT MATERIAL AND WHITE LIGHT EMITTING DEVICE USING THE SAME

(71) Applicant: SAMSUNG ELECTRONICS CO., LTD., Suwon-si, Gyeonggi-do (KR)

(72) Inventor: Ryo Yoshimatsu, Tokyo (JP)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 99 days.

This patent is subject to a terminal disclaimer.

(21) Appl. No.: 14/506,125

(22) Filed: Oct. 3, 2014

(65) Prior Publication Data
US 2015/0055322 A1    Feb. 26, 2015

Related U.S. Application Data

(63) Continuation of application No. 14/060,762, filed on Oct. 23, 2013, now Pat. No. 8,894,884, which is a
(Continued)

(30) Foreign Application Priority Data

Dec. 20, 2006  (JP) ................ 2006-342593

(51) Int. Cl.
*C09K 11/59*  (2006.01)
*C09K 11/77*  (2006.01)
(Continued)

(52) U.S. Cl.
CPC ........ *C09K 11/7734* (2013.01); *C09K 11/0883* (2013.01); *C09K 11/7728* (2013.01);
(Continued)

(58) Field of Classification Search
CPC .................... C09K 11/7734; H01K 33/502
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

JP   10-65221 A    3/1998
JP   10-93146 A    4/1998
(Continued)

OTHER PUBLICATIONS

The 37 CFR 1.32 declaration faxed on Jul. 15, 2014 which was missing from the Examiner's file.
(Continued)

*Primary Examiner* — Carol M Koslow
(74) *Attorney, Agent, or Firm* — McDermott Will & Emery LLP

(57) ABSTRACT

[Problem to be Solved]
Provided is a red emitting fluorescent material, which has a large excitation band and which is capable of efficiently emitting red fluorescence when excited by light emitted from an ultraviolet light emitting device and a blue light emitting device serving as an excitation source, in particular, even by use of an ultraviolet LED having an emission peak at near 390 nm to 400 nm, and which is capable of emitting red fluorescence when excited not only by ultraviolet and blue light from an ultraviolet light emitting device and a blue light emitting device but also by fluorescence emitted from a fluorescent material upon receipt these light beams, thereby emitting high brightness red light, and then, provided is a white light emitting device capable of emitting white light having excellent color reproducing and rendering properties.

(Continued)

[Solution]

The red emitting nitride fluorescent material of the present invention is represented by Formula (1):

$$Sr_{1-x}AlSi_4N_7:Eu_x \qquad (1)$$

where x is a numerical value of greater than 0 to less than 1.

8 Claims, 2 Drawing Sheets

Related U.S. Application Data continuation of application No. 11/954,263, filed on Dec. 12, 2007, now Pat. No. 8,852,454.

(51) Int. Cl.
  *C09K 11/08* (2006.01)
  *H05B 33/12* (2006.01)
  *H01L 33/50* (2010.01)

(52) U.S. Cl.
  CPC ............ *C09K 11/7774* (2013.01); *F21K 9/64* (2016.08); *H05B 33/12* (2013.01); *H01L 33/502* (2013.01); *Y02B 20/181* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,852,454 B2 * | 10/2014 | Yoshimatsu | C09K 11/0883 252/301.4 F |
| 8,894,884 B2 * | 11/2014 | Yoshimatsu | C09K 11/0883 252/301.4 F |
| 2006/0220047 A1 | 10/2006 | Nagatomi et al. |
| 2009/0309112 A1 | 12/2009 | Yoshimatsu |

FOREIGN PATENT DOCUMENTS

| | | | |
|---|---|---|---|
| JP | 10-242513 A | | 9/1998 |
| JP | 11-46015 A | | 2/1999 |
| JP | 2005-235934 A | | 9/2005 |
| JP | 2005-336450 A | | 12/2005 |
| JP | 2006-306982 A | | 11/2006 |
| WO | WO 98/39805 | * | 9/1998 |
| WO | 02/11214 A1 | | 2/2002 |
| WO | 2005-103199 A1 | | 11/2005 |
| WO | WO 2005/103199 | * | 11/2005 |

OTHER PUBLICATIONS

United States Office Action issued in U.S. Appl. No. 11/954,263 dated Dec. 17, 2013.
United States Office Action issued in U.S. Appl. No. 11/954,263 dated Nov. 3, 2010.
United States Office Action issued in U.S. Appl. No. 11/954,263 dated Jul. 16, 2010.
United States Office Action issued in U.S. Appl. No. 11/954,263 dated Oct. 18, 2011.
United States Office Action issued in U.S. Appl. No. 11/954,263 dated Mar. 21, 2012.
United States Office Action issued in U.S. Appl. No. 11/954,263 dated Dec. 17, 2012.
United States Office Action issued in U.S. Appl. No. 11/954,263 dated Jun. 4, 2013.
United States notice of Allownace issued in U.S. Appl. No. 11/954,263 dated May 30, 2014.
J. Ruan et al., "Nitrogen Gas Pressure Synthesis and Photoluminescent Properties of Orange-Red SrAlSi4N7:Eu2+Phosphors for White Light-Emitting Diodes," J. Am. Ceram. Soc., 94[2] 536-542 (2011).

* cited by examiner

RED EMITTING NITRIDE FLUORESCENT MATERIAL AND WHITE LIGHT EMITTING DEVICE USING THE SAME

CROSS REFERENCE TO RELATED APPLICATIONS

This application is a Continuation Application of U.S. patent application Ser. No. 14/060,762, filed Oct. 23, 2013, now U.S. Pat. No. 8,894,884, which is a Continuation Application of U.S. patent application Ser. No. 11/954,263, filed Dec. 12, 2007, now U.S. Pat. No. 8,852,454, which claims priority from Japanese Patent Application No. 2006-342593, filed Dec. 20, 2006, the contents of all of which are incorporated herein by reference in their entireties.

TECHNICAL FIELD

The present invention relates to a red emitting nitride fluorescent material efficiently emitting red light upon receipt of light having a wavelength of ultraviolet or blue, and also relates to a white light emitting device using the red emitting nitride fluorescent material.

This application is based upon and claims the benefit of priority from Japanese patent application No. 2006-342593, filed on Dec. 20, 2006, the disclosure of which is incorporated herein in its entirely by reference.

BACKGROUND ART

Blue light emitting devices such as a light emitting diode (LED) and laser emitting blue light were developed and white light emitting devices using the blue light emitting devices have been put into practical use. The white light emitting devices have excellent light emission efficiency and long product's life. Because of these advantages, the white light emitting devices are expected to be used in a wide variety of fields including backlight of liquid crystal displays and lighting such as indoor lighting and automobile headlight. On the other hand, the brightness and color reproducing and rendering properties of the white light emitting device have been desired to be further improved.

As white light emitting devices, the following three types are known.
1. A first type of white light emitting device has a blue light emitting device in combination with a fluorescent material emitting a complementary blue upon receipt of light emitted from the blue light emitting device.
2. A second type of white light emitting device has a blue light emitting device in combination with a red emitting fluorescent material and a green emitting fluorescent material, which emit fluorescence upon receipt of light emitted from the blue light emitting device.
3. A third type of white light emitting device has an ultraviolet light emitting device, a blue emitting fluorescent material, a green emitting fluorescent material and a red emitting fluorescent material, which emit fluorescence upon receipt of ultraviolet light emitted from the ultraviolet light emitting device.

The first type of white light emitting device is disclosed in Japanese Patent Laid-Open Nos. 10-093146, 10-065221, and 10-242513. The white light emitting device of this type contains an LED formed of a blue light emitting nitride semiconductor and a fluorescent material (referred to as "YAG:Ce fluorescent material"), which emits a complementary blue upon receipt of blue light emitted from the LED and which is formed of a YAG based oxide represented by $(Y, Gd)_3(Al, Ga)_5O_{12}$ and having Ce doped in its host lattice. Particles of the fluorescent material are dispersed in an inclusion resin surrounding the LED. Furthermore, Japanese Patent Laid-Open No. 11-46015 discloses a white light emitting device in which a layer containing a non-particulate fluorescent material represented by $(Re_{1-x}Sm_x)_3(Al_{1-y}Ga_y)_5O_{12}$:Ce is formed on an LED.

These white light emitting devices are used in backlight for a display and an LED display device, etc. However, the emission intensity of red light emission area is not sufficient. Consequently, when the white light emitting device is used in lighting, for example, the skin color looks bluish. Since the natural color of an object cannot be faithfully reproduced as is the case may be, these white light emitting devices have a problem in color reproducing and rendering properties for use in display light for commercial goods.

The second type of white light emitting device is improved in color reproducing and rendering properties compared to the first type. Japanese Patent Laid-Open No. 2005-235934 discloses a white light emitting device using a YAG:Ce fluorescent material, which serves as a fluorescent material emitting a complementary blue upon receipt of blue light from an LED, and a red emitting fluorescent material having a solid solution of Eu in a $CaAlSiN_3$ crystalline phase. Japanese Patent Laid-Open No. 2005-60714 discloses a white light emitting device using a YAG:Ce florescent material and a red emitting florescent material represented by $Ca_{2-x}Si_5N_8$:$Eu_x$. Japanese Patent Laid-Open No. 2004-327518 discloses a white light emitting device using an LED emitting blue light, a europium doped yttrium/aluminum/garnet based green emitting fluorescent material and a europium doped strontium thiogallate based red emitting fluorescent material.

The third type of white light emitting device is a three-wavelength type white light emitting device, which contains an LED emitting ultraviolet light in combination with a blue emitting fluorescent material, a green emitting fluorescent material and a red emitting fluorescent material, as is disclosed in National Publication of International Patent Application No. WO98/39805. In the white light emitting device of this type, a centroclinal transparent resin, which has an ultraviolet light emitting diode arranged therein and three types of fluorescent material powders mixed therein, is formed on a transparent substrate (front panel). To the surface of the transparent resin, mirror processing is applied such that the surface works as a mirror.

These white light emitting devices employ a red emitting fluorescent material such as $Y_2O_2S$:$Eu^{3+}$, which emits light when excited by light having a wavelength of 370 nm. Therefore, red light emission cannot be sufficiently obtained in a white light emitting device having an LED emitting ultraviolet light, which has an emission peak between a wavelength of 390 nm and 400 nm. In the circumstances, it has been desired to develop a red emitting fluorescent material emitting light when excited by light having a wavelength of near 390 nm. Since the visual sensitivity of red light is low compared to blue/green light, it has been desired to develop a red emitting fluorescent material emitting a further brighter light.

[Patent Document 1] Japanese Patent Laid-Open No. 10-093146

[Patent Document 2] Japanese Patent Laid-Open No. 10-065221

[Patent Document 3] Japanese Patent Laid-Open No. 10-242513

[Patent Document 4] Japanese Patent Laid-Open No. 11-46015

[Patent Document 5] National Publication of International Patent Application No. WO02/011214
[Patent Document 6] Japanese Patent Laid-Open No. 2005-235934
[Patent Document 7] Japanese Patent Laid-Open No. 2005-60714
[Patent Document 8] National Publication of International Patent Application No. WO98/39805

DISCLOSURE OF THE INVENTION

Problems to be Solved by the Invention

An object of the present invention is to provide a red emitting nitride fluorescent material having a large excitation band and capable of efficiently emitting red fluorescence when excited by light emitted from an ultraviolet light emitting device and a blue light emitting device serving as an excitation source, in particular, when excited even by use of an ultraviolet LED having an emission peak near 390 nm to 400 nm.

Another object of the present invention is to provide a red emitting fluorescent material capable of emitting red fluorescence when excited not only by ultraviolet or blue light from an ultraviolet light emitting device or a blue light emitting device but also by fluorescence emitted from a fluorescent material upon receipt of the ultraviolet or blue light, thereby emitting high brightness red light, and then to provide a white light emitting device capable of emitting white light having excellent color reproducing and rendering properties.

Means for Solving the Problems

The present invention relates to a red emitting nitride fluorescent material comprising by being represented by Formula (1):

$$Sr_{1-x}AlSi_4N_7:Eu_x \quad (1)$$

where x is a numerical value of greater than 0 to less than 1.

The present invention further relates to a white light emitting device comprising a blue light emitting device and a fluorescent material emitting complementary blue fluorescence upon receipt of blue light emitted from the blue light emitting device, in which the fluorescent material contains a red emitting nitride fluorescent material represented by Formula (1):

$$Sr_{1-x}AlSi_4N_7:Eu_x \quad (1)$$

where x is a numerical value of greater than 0 to less than 1.

The present invention further relates to a white light emitting device comprising a blue light emitting device and a fluorescent material emitting fluorescence upon receipt of blue light emitted from the blue light emitting device, in which the fluorescent material contains a red emitting fluorescent material and a green emitting fluorescent material, and the red emitting fluorescent material contains a red emitting nitride fluorescent material represented by Formula (1):

$$Sr_{1-x}AlSi_4N_7:Eu_x \quad (1)$$

where x is a numerical value of greater than 0 to less than 1.

The present invention further relates to a white light emitting device comprising an ultraviolet light emitting device and a fluorescent material emitting fluorescence upon receipt of ultraviolet light emitted from the ultraviolet light emitting device, in which the fluorescent material contains a blue emitting fluorescent material, a green emitting fluorescent material, and a red emitting fluorescent material, and the red emitting fluorescent material contains a red emitting nitride fluorescent material represented by Formula (1):

$$Sr_{1-x}AlSi_4N_7:Eu_x \quad (1)$$

where x is a numerical value of greater than 0 to less than 1.

Advantages of the Invention

Since the red emitting nitride fluorescent material of the present invention has a wide excitation band ranging from a wavelength of 300 to 550 nm, it can efficiently emit red fluorescence when excited by light emitted from an ultraviolet light emitting device and a blue light emitting device serving as an excitation source. In particular, the red emitting nitride fluorescent material of the present invention can efficiently emit red fluorescence when excited by use of an ultraviolet LED having an emission peak near 390 nm to 400 nm.

Furthermore, the red emitting nitride fluorescent material of the present invention emits red fluorescence when excited also by green light having a wavelength of 520 nm to 570 nm. Therefore, in a white light emitting device containing a green emitting fluorescent material, red light is emitted when excited by light derived from ultraviolet or blue light emitting device and the green emitting fluorescent material. In this manner, high brightness red light can be emitted.

The white light emitting device of the present invention is capable of emitting white light having excellent color reproducing and rendering properties.

BEST MODE FOR CARRYING OUT THE INVENTION

Figure 1:
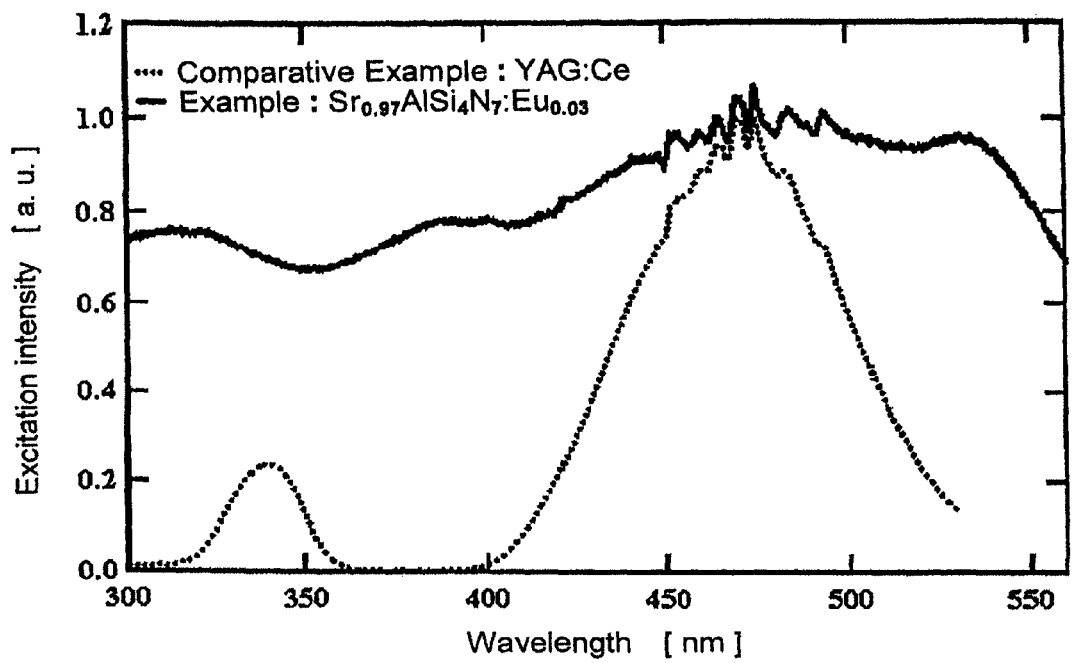
FIG. 1 is the excitation spectrum of a red emitting nitride fluorescent material according to the present invention represented by $Sr_{0.97}AlSi_4N_7:Eu_{0.03}$ in comparison with the excitation spectrum of YAG:Ce.

A red emitting nitride fluorescent material according to the present invention is represented by Formula (1):

$$Sr_{1-x}AlSi_4N_7:Eu_x \quad (1)$$

and contains strontium, aluminum, silicon, nitrogen and europium. In the formula, x is a numerical value of greater than 0 to less than 1 and preferably satisfies the following relationship:

$$0.001 < x \le 0.15.$$

The red emitting nitride fluorescent material has a wide excitation band ranging from a wavelength of 300 to 550 nm. Therefore, as an excitation source for exciting the red emitting nitride fluorescent material to emit fluorescence, use can be made of an ultraviolet light emitting device such as an ultraviolet LED, which emits ultraviolet light having a wavelength of 300 to 400 nm, a blue light emitting device such as a blue LED, which emits blue light having a wavelength of near 400 to 500 nm, and a green emitting fluorescent material which emits green light having a wavelength of near 500 to 550 nm.

The red emitting nitride fluorescent material exhibits a relatively flat excitation spectrum in the range of an ultraviolet wavelength from 300 to 400 nm, meaning that the red emitting nitride fluorescent material can be excited by an ultraviolet light emitting device having a peak wavelength within a wavelength range of 300 to 400 nm and stably emit fluorescence even though the wavelength of the excitation light fluctuates.

The red emitting nitride fluorescent material is excited by an excitation source emitting light having a wavelength within the excitation band to emit red fluorescence having a peak wavelength of 640 to 660.

The first type of white light emitting device of the present invention has a blue light emitting device and a fluorescent material emitting a complementary blue fluorescence upon receipt of blue light emitted from the blue light emitting device and characterized in that the fluorescent material comprises a red emitting nitride fluorescent material.

As the blue light emitting device contained in the white light emitting device, any light emitting device may be used as long as it can emit blue light having a wavelength of 450 to 500 nm. For example, a blue LED and a blue light emitting laser may be mentioned. As a specific material thereof, InGaN system and the like may be mentioned.

The fluorescent material contained in the white light emitting device contains a yellow emitting fluorescent material emitting yellow light, which is complementary color of blue emitted from a blue light emitting device. As the yellow light emitting fluorescent material, any fluorescent material may be used as long as it can be excited by light emitted from the blue light emitting device to emit yellow light having a wavelength of near 570 to 590 nm. For example, YAG:Ce and $CaGa_2S_4$:Eu may be mentioned.

The fluorescent material contains the red emitting nitride fluorescent material. Furthermore, a red emitting fluorescent material may contain, for example, (Ca,Sr)$AlSiN_3$:Eu, (Ca,Sr,Ba)S:Eu capable of emitting red light having a wavelength of near 600 to 760 nm in combination with the red emitting nitride fluorescent material.

Such a first type of white light emitting device is capable of emitting white light having excellent light rendering properties since red light is compensatorily added to the light emission consisting of blue light emitted from a blue light emitting device and yellow light, which is complementary blue, emitted from a fluorescent material.

The second type of white light emitting device of the present invention contains a blue light emitting device and a fluorescent material emitting fluorescence upon receipt of blue light emitted from the blue light emitting device and characterized in that the fluorescent material contains a red emitting fluorescent material and a green emitting fluorescent material, and the red emitting fluorescent material contains the red emitting nitride fluorescent material.

As the blue light emitting device and the red emitting fluorescent material containing the red emitting nitride fluorescent material used herein, the same blue light emitting device and the red emitting fluorescent material as mentioned above can be used.

As the green emitting fluorescent material, use can be made of a fluorescent material emitting green having a wavelength of near 500 to 570 nm when excited by blue light emitted from the blue light emitting device. Specific examples of the green emitting fluorescent material may include $(Ba,Sr)_2SiO_4$:$Eu^{2+}$, $(Sr,Ca,Ba)Ga_2S_4$:$Eu^{2+}$, β-sialon:$Eu^{2+}$ or $Ca_3Sc_2Si_3O_{12}$:Ce. The green light emitted from the green emitting fluorescent material excites the red emitting nitride fluorescent material to emit red light having a wavelength of 640 to 660 nm.

Such a second type of white light emitting device is capable of emitting white light having excellent color reproducing and rendering properties since blue light emitted from a blue light emitting device, green light emitted from a green light emitting device and high brightness red light emitted from a red emitting nitride fluorescent material when excited by the blue light and green light are all mixed.

Furthermore, the third type of the white light emitting device of the present invention contains an ultraviolet light emitting device and a fluorescent material emitting fluorescence upon receipt of the ultraviolet light emitted from the ultraviolet light emitting device and characterized in that the fluorescent material contains a blue emitting fluorescent material, a green emitting fluorescent material and a red emitting fluorescent material, and the red emitting fluorescent material contains a red emitting nitride fluorescent material.

As the ultraviolet light emitting device, any light emitting device may be used as long as it emits ultraviolet light having a wavelength of near 400 to 450 nm. For example, an ultraviolet LED and an ultraviolet light emitting laser may be mentioned. As a specific material thereof, GaN system or ZnO system may be mentioned.

As the blue emitting fluorescent material, use can be made of a fluorescent material emitting blue light having a wavelength of near 450 to 500 nm when excited by the ultraviolet light emitted from the ultraviolet light emitting device. Specific examples of the blue emitting fluorescent material include ZnS:Ag or $BaMgAl_{10}O_{17}$:Eu. As the red emitting fluorescent material capable of being used in combination with the red emitting nitride fluorescent material in the third type of white light emitting device, specifically, (Ca,Sr)$AlSiN_3$:Eu, $La_2O_2S$:Eu and the like may be mentioned. Examples of the green emitting fluorescent material may include $BaMgAl_{10}O_{17}$:$Eu^{2+}$, $Mn^{2+}$, $(Ba,Sr)_2SiO_4$:$Eu^{2+}$, $(Sr,Ca,Ba)Ga_2S_4$:$Eu^{2+}$ or β-sialon:$Eu^{2+}$.

Such a third type of white light emitting device is capable of emitting white light having excellent color reproducing and rendering properties since blue light emitted from a blue emitting fluorescent material, green light emitted from a green fluorescent material and high brightness red light emitted from a red emitting nitride fluorescent material when excited by the ultraviolet light from an ultraviolet light emitting device and green light are all mixed.

For producing a red emitting nitride fluorescent material according to the present invention, use may be made of a method of mixing raw-material compounds containing constituent atoms so as to obtain a desired atomic composition and baking the mixture.

Examples of the raw-material compounds for a red emitting nitride fluorescent material may include nitrides such as strontium nitride ($Sr_3N_2$), aluminum nitride (AlN) and silicon nitride ($Si_3N_4$), and oxides such as europium oxide ($Eu_2O_3$). Strontium nitride and europium nitride can be obtained by nitriding metal strontium and metal europium, respectively. These raw-material compounds are weighed and taken so as to obtain a desired atomic composition and mixed well in dry conditions to prepare a mixture.

The mixture is charged in a heat resistant container such as a carbon crucible, a carbon tray, a boron nitride crucible or a boron nitride tray and baked at 1500° C. to 2000° C., preferably 1600° C. to 1900° C. for 3 to 10 hours in a reducing atmosphere containing hydrogen and nitrogen in mixture. The baked product thus obtained is pulverized, washed, dried and sieved to obtain a red emitting nitride fluorescent material according to the present invention. The mixing ratio of hydrogen to nitrogen in the reducing atmosphere is preferably 10 vol % to 90 vol % and more preferably, around 75% relative to the total volume of hydrogen and nitrogen. Furthermore, as the reducing atmosphere, an ammonia atmosphere may be used. A high-pressure atmosphere containing nitrogen gas of about 10 atm. or less may be used. Baking may be performed in a plurality of times.

EXAMPLES

A method for producing a red emitting nitride fluorescent material of the present invention, for example, $Sr_{0.97}AlSi_4N_7:Eu_{0.03}$ (x=0.03) will be described below.

Powdery $Sr_3N_2$, AlN, $Si_3N_4$ and $Eu_2O_3$ were used as raw material compounds. First, 9.8488 g of $Sr_3N_2$, 13.1482 g of AlN, 20.0000 g of $Si_3N_4$ and 0.9407 g of $Eu_2O_3$ were weighed so as to satisfy an atomic composition ratio of SnAl:Si:N:Eu=0.97:1:4:7:0.03, placed in an agate mortar and mixed well by an agate stick. The powder mixture was charged in a boron nitride crucible, which was then set in en electric furnace and baked at 1600° C. for 6 hours in a reducing atmosphere containing nitrogen and hydrogen in a volume ratio of 1:3. After baking, the baked product thus obtained was gradually cooled, pulverized and mixed to obtain the titled sample.

The obtained sample was charged in a recess (0.8 cm width×1 cm height×0.1 cm depth) formed in a flat plate (1 cm×2 cm) to obtain emission spectrum and excitation spectrum, and further, chromaticity coordinates.

Excitation Spectrum

The excitation spectrum of the aforementioned sample was obtained by use of a fluorospectrophotometer (RF-5300 PC type, manufactured by Shimadzu Corporation). More specifically, the sample was irradiated with excitation light beams different in wavelength, and light emitted from the sample was determined for emission intensity at a monitoring wavelength. The intensity of emission light corresponding to the wavelength of each excitation light beam was plotted to obtain an excitation spectrum. The excitation spectrum thus obtained corresponds to the absorption spectrum of the sample. FIG. 1 shows the excitation spectrum of the sample in combination with the excitation spectrum of a YAG:Ce fluorescent material (Comparative Example) emitting complementary blue upon receipt of light emitted from a blue LED.

The excitation spectrum shown in FIG. 1 is obtained by exciting an $Sr_{0.97}AlSi_4N_7:Eu_{0.03}$ fluorescent material in a scanning manner with light beams varied in wavelength within the range of 300 to 560 nm, measuring the intensity of light emitted from the fluorescent material at a monitoring wavelength of 650 nm, obtaining a relative intensity of the measured intensity value to the maximum emission intensity of a YAG:Ce fluorescent material at the monitoring wavelength, which is regarded as 1, and plotting the relative intensity. The excitation spectrum shown in FIG. 1 shows that the $Sr_{0.97}AlSi_4N_7:Eu_{0.03}$ fluorescent material is a red emitting fluorescent material, which is excited by light beams within an extremely broad band ranging from 300 and 550 nm and having a peak wavelength at 475 nm to emit red light.

Light Emission Spectrum

Figure 2:
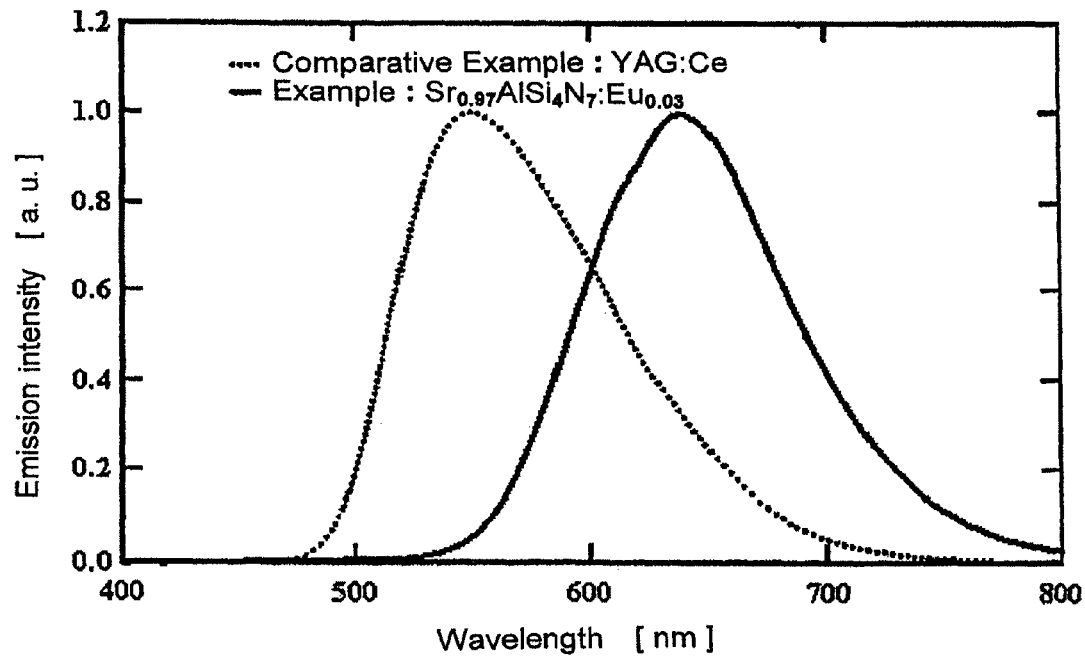
FIG. 2 is the emission spectrum of a red emitting nitride fluorescent material according to the present invention represented by $Sr_{0.97}AlSi_4N_7:Eu_{0.03}$ in comparison with the emission spectrum of YAG:Ce.

Light emission spectrum of the sample was obtained by irradiating the sample with light from an excitation source and measuring light emitted from the sample by use of a spectrophotometer (PMA-11 type, manufactured by Hamamatsu Photonics K.K.). FIG. 2 shows the emission spectrum of the sample in combination with the emission spectrum of a YAG:Ce fluorescent material.

The emission spectrum shown in FIG. 2 is obtained by obtaining relative intensities of the $Sr_{0.97}AlSi_4N_7:Eu_{0.03}$ fluorescent material and the YAG:Ce fluorescent material when irradiated with light emitted from a blue LED (Trade name: NSPB310A: Nichia Corporation, CIE chromaticity coordinates (0.130, 0.075) in the chromaticity diagram of JIS Z8110) relative to its respective maximum emission intensities (regarded as 1) and plotting them. The emission spectrum of FIG. 2 shows that the $Sr_{0.97}AlSi_4N_7:Eu_{0.03}$ fluorescent material emits red light having a peak wavelength at 644 nm.

Color Rendering Properties

The light emitted from the sample, from which excitation light was removed by use of a filter, was measured by a fluorospectrophotometer (RF-5300 PC type, manufactured by Shimadzu Corporation) and thereafter CIE chromaticity coordinates were computationally obtained. The results are shown in Table 1.

TABLE 1

| Phosphor | CIE chromaticity coordinates (x, y) |
|---|---|
| YAG:Ce | (0.427, 0.551) |
| $Sr_{0.97}AlSi_4N_7:Eu_{0.03}$ | (0.627, 0.367) |

Figure 3:
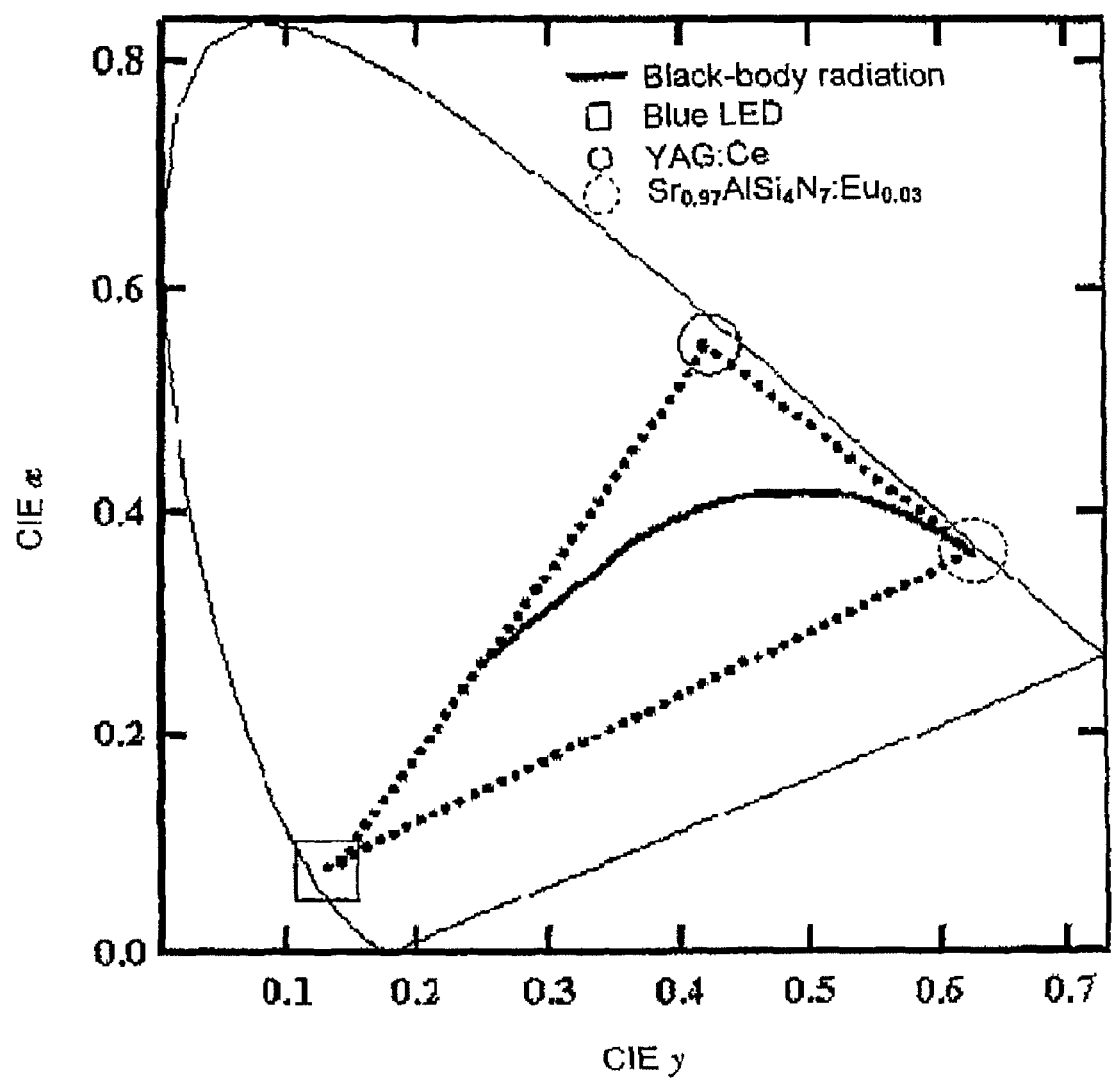
FIG. 3 is a graph showing the range of white light obtained from a white light emitting device according to the present invention.

FIG. 3 shows light color region obtained by using a blue LED (CIE chromaticity coordinates (0.130, 0.075)), a YAG:Ce fluorescent material (CIE chromaticity coordinates (0.427, 0.551)) and an $Sr_{0.97}AlSi_4N_7:Eu_{0.03}$ fluorescent material (CIE chromaticity coordinates (0.627, 0.367)) on the chromaticity diagram of JIS Z8110.

The white of a white light emitting device containing a blue LED (CIE chromaticity coordinates (0.130, 0.075)) and a YAG:Ce fluorescent material (CIE chromaticity coordinates (0.427, 0.551)) exhibits white chromaticity defined by chromaticity coordinates (0.27, 0.28) on the black-body radiation line and looks bluish white.

When an $Sr_{0.97}AlSi_4N_7:Eu_{0.03}$ fluorescent material is used in combination of them, the color of the region surrounded by lines connecting the three points: blue defined by CIE chromaticity coordinates (0.130, 0.075), yellow defined by CIE chromaticity coordinates (0.427, 0.551) and red defined by CIE chromaticity coordinates (0.627, 0.367) can be reproduced. As a result, it is found that warm white light having a high color temperature is obtained.

Results

The red emitting nitride fluorescent material of the present invention emits deep red having an emission peak wavelength at near 650 nm.

Furthermore, the red emitting nitride fluorescent material of the present invention, since it has a broad excitation band within the wavelength range of 300 to 550 nm, can be excited not only by a light emitting device emitting ultraviolet light but also by a light emitting device emitting blue light. Even though the wavelength of the excitation light fluctuates by several nm, the resultant reduction of the excitation rate can be suppressed, with the result that red light can be efficiently emitted.

The white light emitting device using a red emitting nitride fluorescent material according to the present invention has excellent color reproducing and rendering properties and thus suitably used in various types of lighting such as backlight of a display and an LED display device.

What is claimed is:

1. A red emitting nitride fluorescent material comprising by being represented by Formula (1):

$$Sr_{1-x}AlSi_4N_7:Eu_x \qquad (1)$$

wherein x is a numerical value of greater than 0 to less than 1.

2. A white light emitting device comprising:
a blue light emitting device and a fluorescent material emitting complementary blue fluorescence upon receipt of blue light emitted from the blue light emitting device,
wherein the fluorescent material contains the red emitting nitride fluorescent material of claim 1 represented by Formula (1).

3. The white light emitting device of claim 2, wherein the fluorescent material further contains a yellow emitting fluorescent material.

4. A white light emitting device comprising:
a blue light emitting device and a fluorescent material emitting fluorescence upon receipt of blue light emitted from the blue light emitting device,
wherein the fluorescent material contains a red emitting fluorescent material and a green emitting fluorescent material, and the red emitting fluorescent material contains a red emitting nitride fluorescent material of claim 1 represented by Formula (1).

5. A white light emitting device comprising:
an ultraviolet light emitting device and a fluorescent material emitting fluorescence upon receipt of the ultraviolet light emitted from the ultraviolet light emitting device,
wherein the fluorescent material contains a blue emitting fluorescent material, a green emitting fluorescent material, and a red emitting fluorescent material, and the red emitting fluorescent material contains the red emitting nitride fluorescent material of claim 1 represented by Formula (1).

6. A red emitting nitride fluorescent material represented by Formula (1):

$$Sr_{1-x}AlSi_4N_7:Eu_x \qquad (1)$$

wherein x is a numerical value of greater than 0 to less than 1, and
the red emitting nitride fluorescent material emits fluorescence which has an emission peak wavelength between 640 nm and 660 nm.

7. The red emitting nitride fluorescent material of claim 6, wherein the red emitting nitride fluorescent material is excited by light having a wavelength in a range of 300 to 550 nm.

8. A light emitting device comprising:
a blue or ultraviolet (UV) light emitting diode; and
the red emitting nitride fluorescent material of claim 1 represented by Formula (1).

* * * * *